(12) United States Patent
Park et al.

(10) Patent No.: US 7,170,276 B2
(45) Date of Patent: Jan. 30, 2007

(54) DEVICE FOR COMPENSATING FOR HEAT DEVIATION IN A MODULAR IC TEST HANDLER

(75) Inventors: Chan Ho Park, Chonan-Shi (KR); Hyun Joo Hwang, Uiwang-shi (KR); Jae Bong Seo, Iksan-shi (KR); Young Geun Park, Yongin-shi (KR); Ho Keun Song, Seongnam-shi (KR)

(73) Assignee: Mirae Corporation, Chungchongnam-Do (KR)

( * ) Notice: Subject to any disclaimer, the term of this patent is extended or adjusted under 35 U.S.C. 154(b) by 143 days.

(21) Appl. No.: 10/657,179

(22) Filed: Sep. 9, 2003

(65) Prior Publication Data

US 2004/0124845 A1    Jul. 1, 2004

(30) Foreign Application Priority Data

Dec. 31, 2002   (KR) ...................... 10-2002-0087797

(51) Int. Cl.
*G01R 31/02*       (2006.01)
(52) U.S. Cl. .................................... 324/158.1; 324/760
(58) Field of Classification Search ................ 324/760, 324/158.1, 765; 165/80.2, 80.1, 201, 260, 165/80.3, 80.5; 73/863.11; 374/135; 361/679, 361/688, 689
See application file for complete search history.

(56) References Cited

U.S. PATENT DOCUMENTS

| | | | | |
|---|---|---|---|---|
| 3,710,251 A * | 1/1973 | Hagge et al. | ............... | 324/760 |
| 4,782,291 A * | 11/1988 | Blandin | ................... | 324/158.1 |
| 5,977,785 A * | 11/1999 | Burward-Hoy | ............. | 324/760 |
| 6,069,483 A * | 5/2000 | Maxwell et al. | ............ | 324/760 |
| 6,445,203 B1 * | 9/2002 | Yamashita et al. | .......... | 324/760 |
| 6,617,843 B1 * | 9/2003 | Min et al. | ................. | 324/158.1 |
| 6,861,861 B1 * | 3/2005 | Song et al. | ................. | 324/760 |
| 2002/0185259 A1 * | 12/2002 | Park | .......................... | 165/80.3 |
| 2002/0185269 A1 * | 12/2002 | Sato | ........................... | 165/185 |
| 2004/0051545 A1 * | 3/2004 | Tilton et al. | ................ | 324/760 |
| 2004/0107718 A1 * | 6/2004 | Bowman et al. | ........... | 62/259.2 |

* cited by examiner

*Primary Examiner*—Minh N. Tang
(74) *Attorney, Agent, or Firm*—Fleshner & Kim, LLP

(57) ABSTRACT

A device for compensating for heat generation in a modular IC test handler is provided which includes at least one supporting member positioned adjacent to a press unit of the handler, and having a cooling fluid flow passage formed therein for flow of cooling fluid, and a plurality of cooling fluid spraying units for spraying the cooling fluid supplied through the cooling fluid flow passage toward faces of modular ICs in an oblique direction from a position between adjacent push bars of the press unit, thereby spraying cooling fluid directly onto ICs attached to a surface of modular ICs during testing and enhancing an efficiency of heat compensation.

31 Claims, 8 Drawing Sheets

DEVICE FOR COMPENSATING FOR HEAT DEVIATION IN A MODULAR IC TEST HANDLER

BACKGROUND OF THE INVENTION

1. Field of the Invention

The invention relates to a handler for testing a modular integrated circuit (IC). More particularly, the invention relates to a device for compensating for heat deviation in a modular IC test handler.

2. Background of the Related Art

In general, a modular IC, having a plurality of IC chips and other devices soldered on a substrate to form an integrated circuit, is subjected to various tests, after fabrication and before shipment, in order to inspect for defects. The modular IC has a very important function with respect to the different components mounted on a mother board of a computer, and thus discovering defects prior to installation is very important.

FIG. 1 illustrates an exemplary modular IC test handler for automatic loading/unloading and testing modular ICs. The modular IC test handler of FIG. 1 includes a loading part 1 for mounting a plurality of modular ICs positioned on a tray on a test carrier C, a pre-heating chamber 2 through which the test carriers C, each having a tray of modular ICs mounted thereon, are conveyed in succession by a conveyor (not shown) and then heated/cooled to a preset temperature, a test chamber 3 for mounting the modular ICs disposed on the carrier C on a test socket 7 connected to an external testing device and carrying out testing, a defrosting chamber 4 for cooling or heating the modular ICs by cooling or heating the respective carriers C so that the modular ICs return to an initial room temperature state, and an unloading part 5 for separating tested modular ICs from the carrier C, classifying, and then loading the modular ICs on designated trays according to a test result. The modular IC test handler carries out a room temperature test, a high temperature test, and a low temperature test within a preset temperature range.

However, heat generated in the modular IC itself during testing, when the modular IC is mounted on the test socket 7 in the test chamber 3, not only damages the modular IC, but also impedes testing within an accurate temperature range, resulting in poor testing efficiency. Accordingly, in the related art, a device for compensating for heat deviation was developed and employed for solving the foregoing problem. In the related art device, a sprayer fitted to a press unit, which presses and connects the modular IC to the test socket, sprays cooling fluid, such as liquid gas, for example, liquid nitrogen, toward the modular IC, thereby suppressing heat deviation in the modular IC.

However, the related art device for compensating for heat deviation has poor heat compensation efficiency because, though the cooling fluid is designed to be sprayed toward and between a plurality of modular ICs connected to the test sockets, the cooling fluid can not be directly sprayed onto a surface of the modular IC chip, the actual heat generating body, which is attached to a respective modular IC.

SUMMARY OF THE INVENTION

An object of the invention is to solve at least the above problems and/or disadvantages and to provide at least the advantages described hereinafter.

Accordingly, the invention is directed to a device for compensating for heat deviation in a modular IC test handler that substantially obviates one or more of the problems due to limitations and disadvantages of the related art.

One object of the invention is to provide a device for compensating for heat deviation in a modular IC test handler, in which cooling fluid is directly sprayed onto a surface of ICs mounted on a modular IC during testing.

To achieve at least these and other advantages and in accordance with the purposes of the invention, as embodied and broadly described, a device for compensating for heat generation in a modular IC test handler configured to receive cooling fluid from an exterior source and spraying the cooling fluid onto modular ICs during testing is provided according to an embodiment of the invention, wherein the device is attached to a press unit including a frame, and a plurality of push bars are arranged at fixed intervals on a front surface of the frame for pushing edges of modular ICs mounted on carriers to connect the modular ICs to test sockets. The device for compensating for heat deviation according to an embodiment of the invention includes at least one supporting member provided adjacent to the press unit and having a cooling fluid flow passage formed therein for flow of cooling fluid, and at least one cooling fluid spraying unit configured to spray the cooling fluid supplied through the cooling fluid flow passage toward faces of modular ICs in an oblique direction. The invention improves cooling efficiency as cooling fluid is sprayed from the spray holes toward a surface of the modular IC on which ICs are attached.

The cooling fluid flow passage may include a plurality flow passages divided, respectively, by partitions extending in a lateral direction. For example, the cooling fluid flow passage may include an upper flow passage, a middle flow passage, and a lower flow passage. The upper flow passage may be in communication with end parts of the nozzle members. The lower flow passage may include an inlet at one side for receiving cooling fluid from an exterior source. The partitions may have a plurality of connection holes positioned at fixed intervals for flow of the cooling fluid introduced thereto through the lower flow passage, the middle flow passage, and the upper flow passage. Ends of the nozzle members and the connection holes may be arranged staggered with respect to one another, thereby compensating for pressure heads and providing a comparatively uniform spray of cooling fluid through the nozzle members.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF PREFERRED EMBODIMENTS

Reference will now be made in detail to embodiments of the invention, examples of which are illustrated in the accompanying drawings. For a better understanding of the system and operation of a device for compensating for heat deviation according to the invention, a test chamber in a modular IC test handler having a device for compensating for heat deviation according to an embodiment of the invention will be hereby described with reference to FIG. 2.

Figure 1:
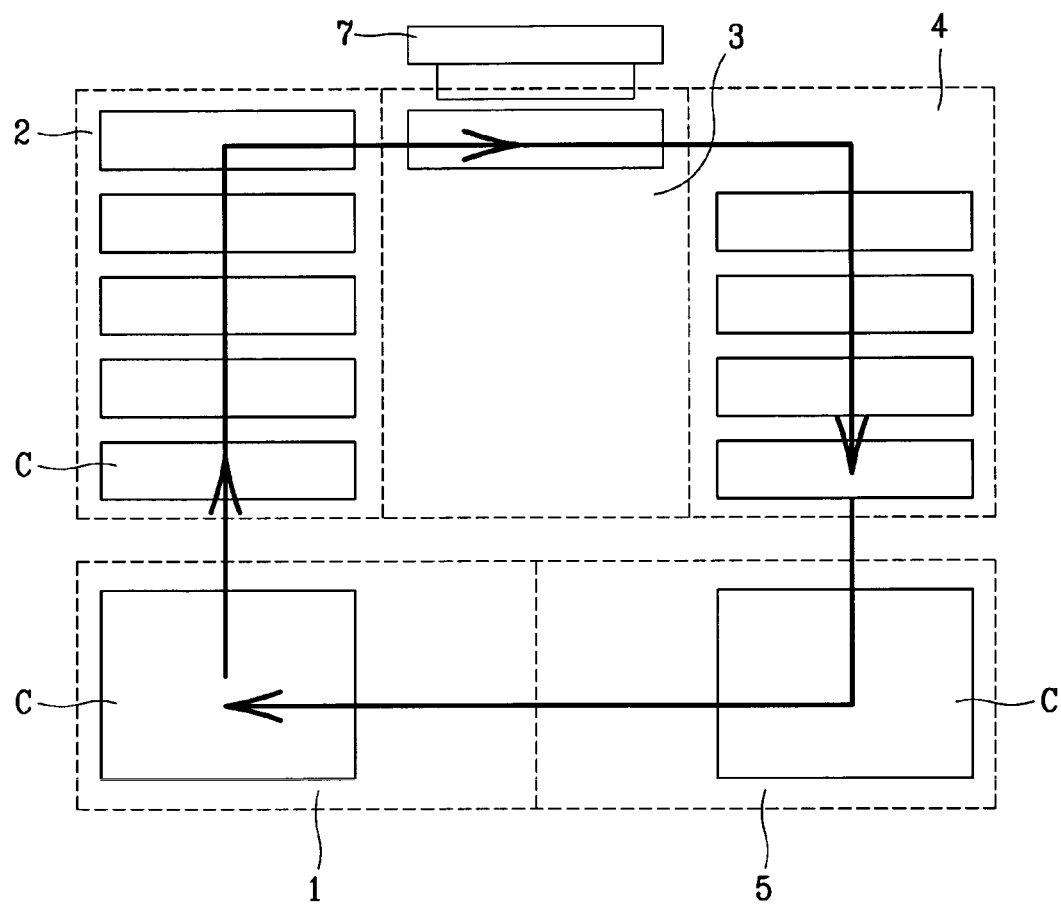
FIG. 1 is a schematic view of a related art exemplary modular IC test handler for automatic loading/unloading and testing of a modular IC.
Figure 2:
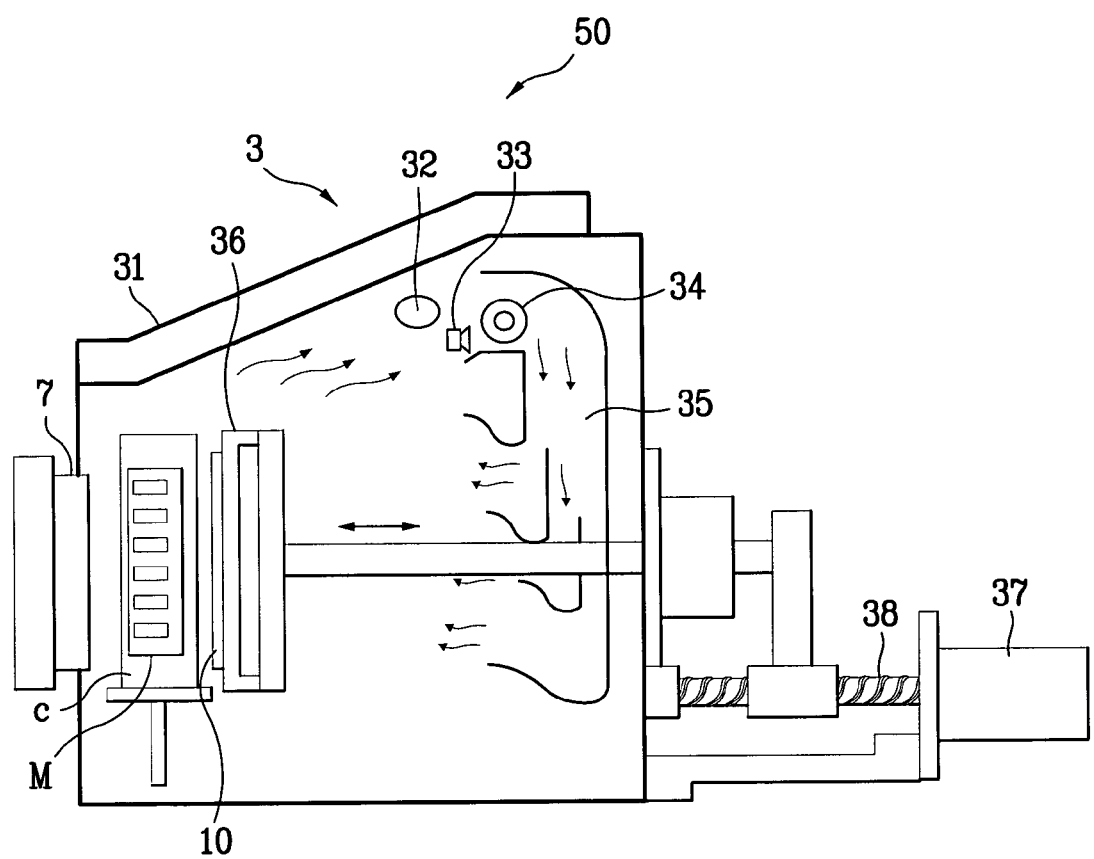
FIG. 2 is a schematic side view of a test chamber in a modular IC test handler having a device for compensating for heat deviation in accordance with an embodiment of the invention.

Referring to FIG. 2, a test chamber 3 includes an air tight openable/closable housing 31 having a test socket 7 connected to an external test device (not shown). The test socket 7 is configured for electric connection to a modular IC 'M' disposed on a carrier 'C' and conveyed into the housing 31 for carrying out testing. A press unit 36 is movably mounted at a rear of the test socket 7 in the housing 31 for pushing the modular IC forward to connect the modular IC to the test socket 7 when the carrier C is positioned adjacent the test socket 7. A motor 37 and a ball screw 38 are coupled to the press unit 36 from outside the housing 31, which move the press unit 36 back and forth.

The test chamber 3 also includes a cooling and heating device 50 for bringing an inside of the test chamber 3 to a required temperature. The cooling and heating device of FIG. 2 includes a spray nozzle 33 connected to a source of cooling fluid (not shown), such as a cooling fluid tank for spraying a cooling fluid, such as liquid gas, for example, liquid nitrogen, and an electric heater 32 for generating heat electrically. A fan 34 is disposed at one side of the spray nozzle 33 and the electric heater 32. The fan 34 blows the cooling fluid sprayed from the spray nozzle 33 or hot air heated by the electric heater 32 toward the carrier C. As shown in FIG. 2, a guide duct 35 guides the cooling fluid or the hot air blown by the fan 34 toward the carrier C.

In the meantime, a device 10 for compensating for heat deviation according to the invention is attached to the press unit 36 and directs a spray of cooling fluid onto a surface of the modular IC under test, either continuously or intermittently. The system and operation will be described, with reference to FIGS. 3~8. The press unit 36 win first be described with reference to FIG. 3.

Figure 3:
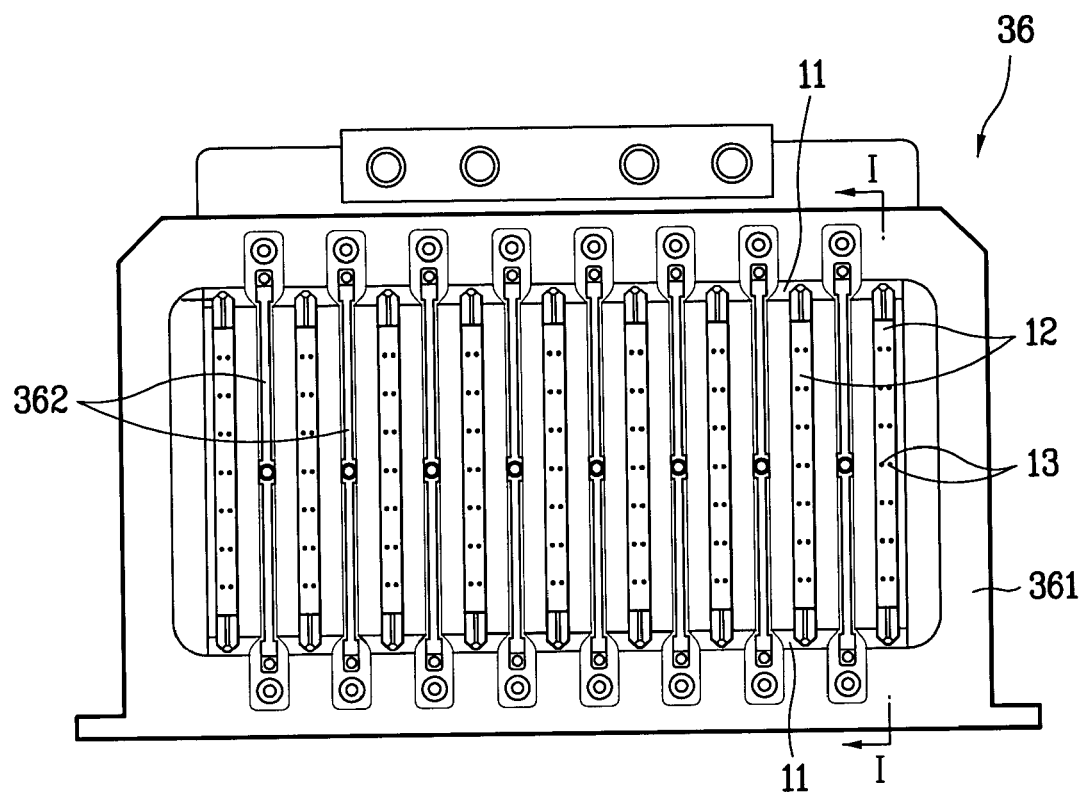
FIG. 3 is a schematic front view of a press unit having a device for compensating for heat deviation in accordance with an embodiment of the invention.
Figure 4:
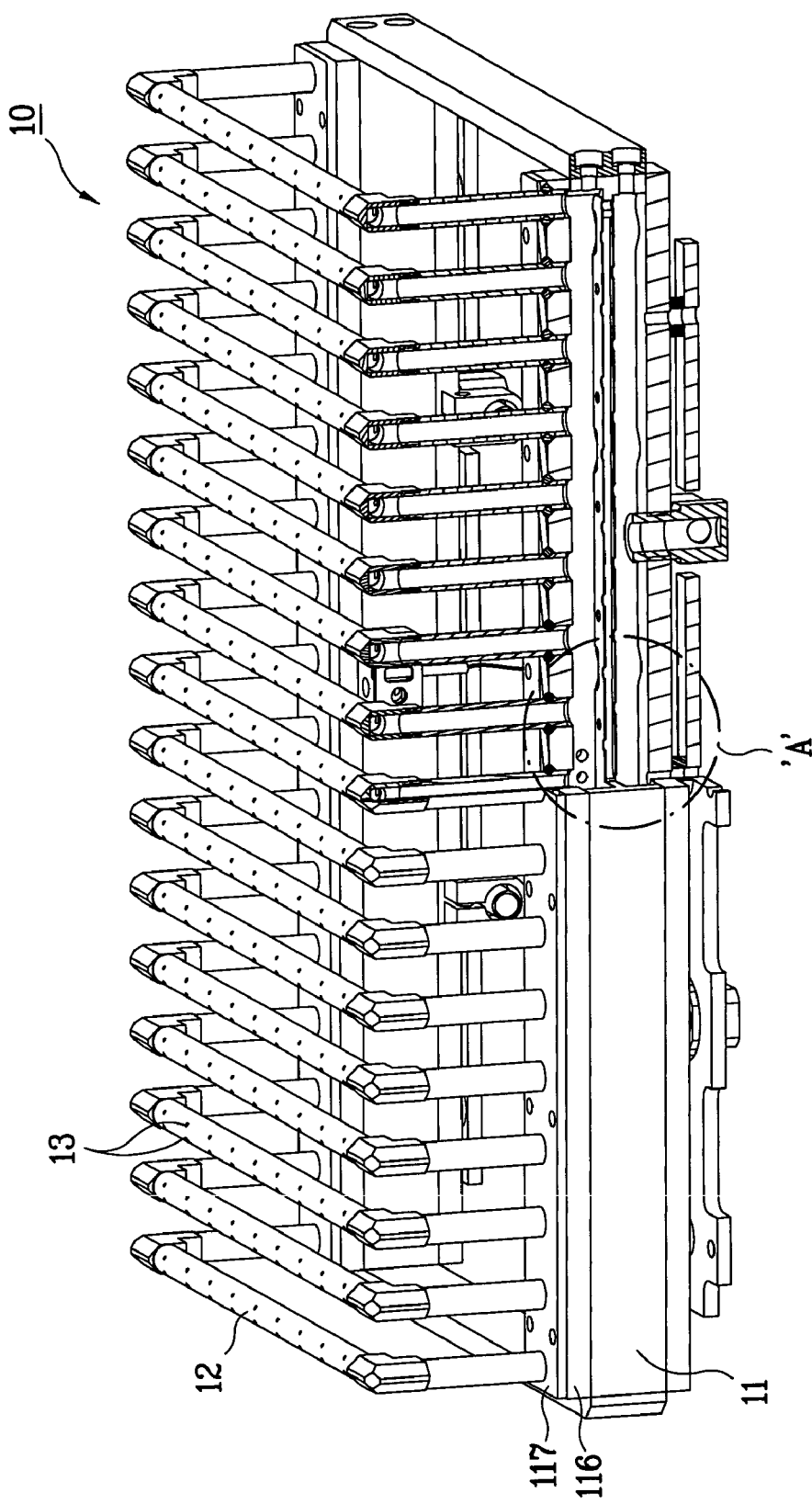
FIG. 4 is a schematic perspective view of a device for compensating for heat deviation in accordance with an embodiment of the invention, with a partial cut away view designated as 'A'.

Referring to FIG. 3, the press unit 36 includes a frame 361, which in the embodiment of FIG. 3 is substantially rectangular, although other shapes may also be appropriate. A plurality of push bars 362 is arranged at fixed intervals on a front surface of the frame 361 for pushing edges of the modular ICs mounted on the carrier C to connect the modular ICs to the test socket 7.

The device 10 for compensating for heat deviation includes supporting member 11 fixed, respectively, to an upper end and a lower end of the frame 361 of the press unit 36. Each supporting member 11 has a cooling fluid flow passage therein. A plurality of hollow nozzle members 12 have ends in communication with the cooling fluid flow passage in the supporting members 11, as shown FIGS. 4 and 5. The nozzle members 12 shown in FIG. 3 are substantially '[' formed bars; however, other configurations may also be appropriate. In the embodiment of FIG. 3, the nozzle members 12 are arranged at fixed intervals along the supporting members 11 such that each of the nozzle members 12 is disposed between adjacent push bars 362. However, other arrangements may also be appropriate.

Each nozzle member 12 has a plurality of spray holes 13 positioned at intervals along a length direction of the nozzle member 12. In the embodiment of FIG. 3, the spray holes 13 are arranged in pairs, wherein each pair of the spray holes 13 are formed adjacently in a circumferential direction such that the spray holes 13 are directed away from a central plane formed by the nozzle member 12. The pairs of spray holes 13 are also positioned at fixed intervals.

Figure 5:
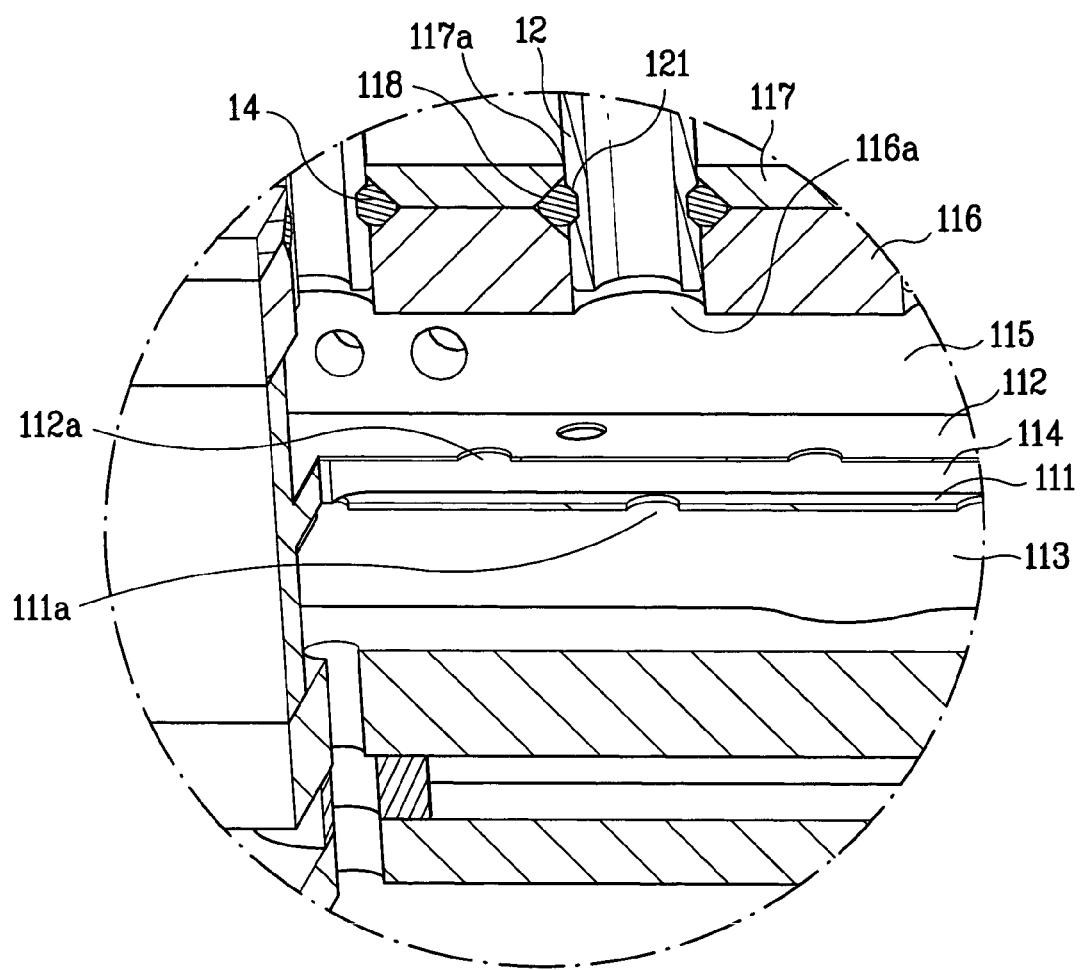
FIG. 5 is an enlarged schematic view of the partial cut away view designated as 'A' in FIG. 4.
Figure 6:
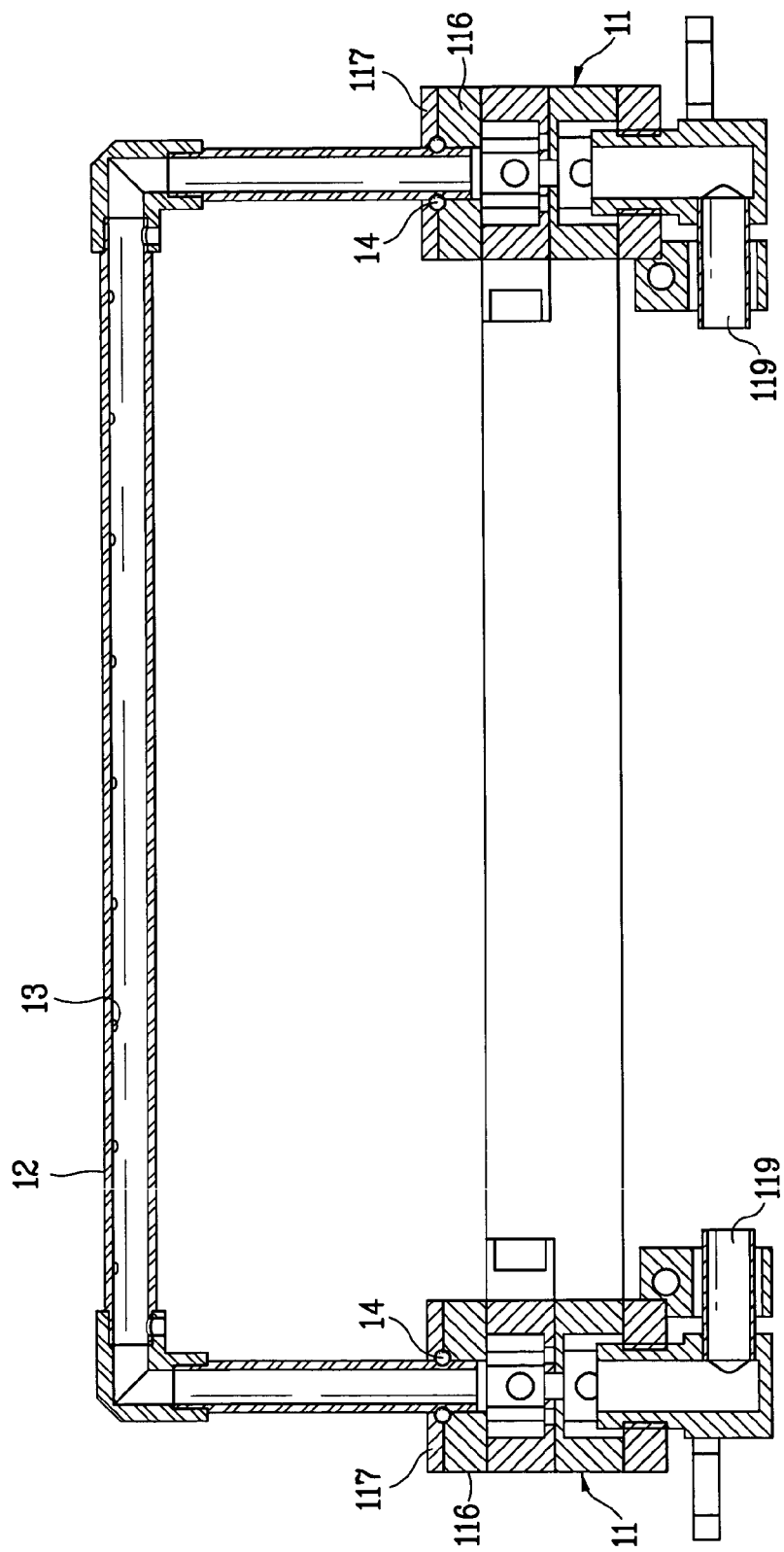
FIG. 6 is a schematic cross-sectional view taken along line I—I in FIG. 3.

As shown in FIG. 5, the cooling fluid flow passage in the supporting member 11 may be divided into three layers, including a lower flow passage 113, an intermediate buffer flow passage 114, and an upper flow passage 115 separated by an upper partition 112 and a lower partition 111. The lower flow passage 113 has an inlet 119 at one end for receiving cooling fluid from an exterior source, and the upper flow passage 115 is in communication with an end of the nozzle member 12.

The upper partition 112 and the lower partition 111 have connection holes 112a and 111a positioned at fixed intervals. The connection hole 112a in the upper partition 112 may be staggered with respect to the end of the nozzle member 12, and the connection holes 111a in the lower partition 111 may be staggered with respect to the connection holes 112a in the upper partition 112. That is, positions of the nozzle member 12 and the connection holes 112a in the upper partition 112 and the connection holes 111a in the lower partition 111 may be in a zigzag form. This configuration eliminates a pressure head from the cooling fluid introduced into the cooling fluid flow passage, providing for uniform spray of the cooling fluid through the nozzle member 12.

If there is only one cooling fluid flow passage, a pressure of the cooling fluid is high in the vicinity of an inlet through which the cooling fluid is introduced, and lower in proportion to a distance from the inlet. Consequently, though spray of cooling fluid at a high pressure can be expected from the nozzle member in the vicinity of the inlet, spray of cooling fluid at a low pressure can be expected from the nozzle member far from the inlet. This causes an imbalance in overall cooling performance and ineffective heat deviation compensation.

However, if the cooling fluid flow passage is divided into multiple layers, for example, three are provided in the embodiment of FIG. 5, and the connection holes 112a and 111a are staggered with respect to one another, the cooling fluid introduced through the inlet 119 passes through many stages, with gradual correction of the pressure head at each of the stages. This configuration permits spray of the cooling fluid at a comparatively uniform pressure throughout the nozzle member 12, which will be described in more detail below.

An upper part of the supporting member 11 to which the nozzle member 12 is connected includes a lower supporting member 116 having a plurality of pass through holes 116a positioned at fixed intervals for receiving therein ends of the nozzle members 12, and an upper supporting member 117 fastened to a top of the lower supporting member 116 with a fastening device, such as screws, and having pass through holes 117a at positions corresponding to the pass through holes 116a in the lower supporting member 116.

Upper ends of the pass through holes 116a in the lower supporting member 116 and corresponding lower ends of the pass through holes 117a in the upper supporting member 117 may be sloped, such that a '<' shaped groove 118 is formed between the pass through holes 116a and the pass through holes 117a when joined together. A groove 121 may also be formed in the end of the nozzle member 12 at a position corresponding to the groove 118, as shown in FIG. 5.

An elastic sealing device 14, such as an elastic sealing ring, for example, an O-ring, may be provided between the groove 118 and the groove 121 in the nozzle member 12, so that the end of the nozzle member 12 does not fall off of the pass through holes 116a and 117a. The sealing ring 14, not only holds the nozzle member 12 in the pass through holes 116a and 117a, but also positions and seals the nozzle member 12 with respect to the supporting member 11 when the nozzle member 12 is attached to the supporting member 11. The sealing ring 14 may be formed of silicone or rubber; however, other materials may also be appropriate.

The operation of a device for compensating for heat deviation according to an embodiment of the invention will be described below.

Once the press unit 36 presses and connects modular ICs mounted on the carrier C to the test sockets 7, the testing proceeds. Cooling fluid is supplied to the lower flow passage 113 from an external cooling fluid source (not shown) through the inlets 119 in the supporting members 11 of the device 10 for compensating for heat deviation according to an embodiment of the invention.

Figure 7:
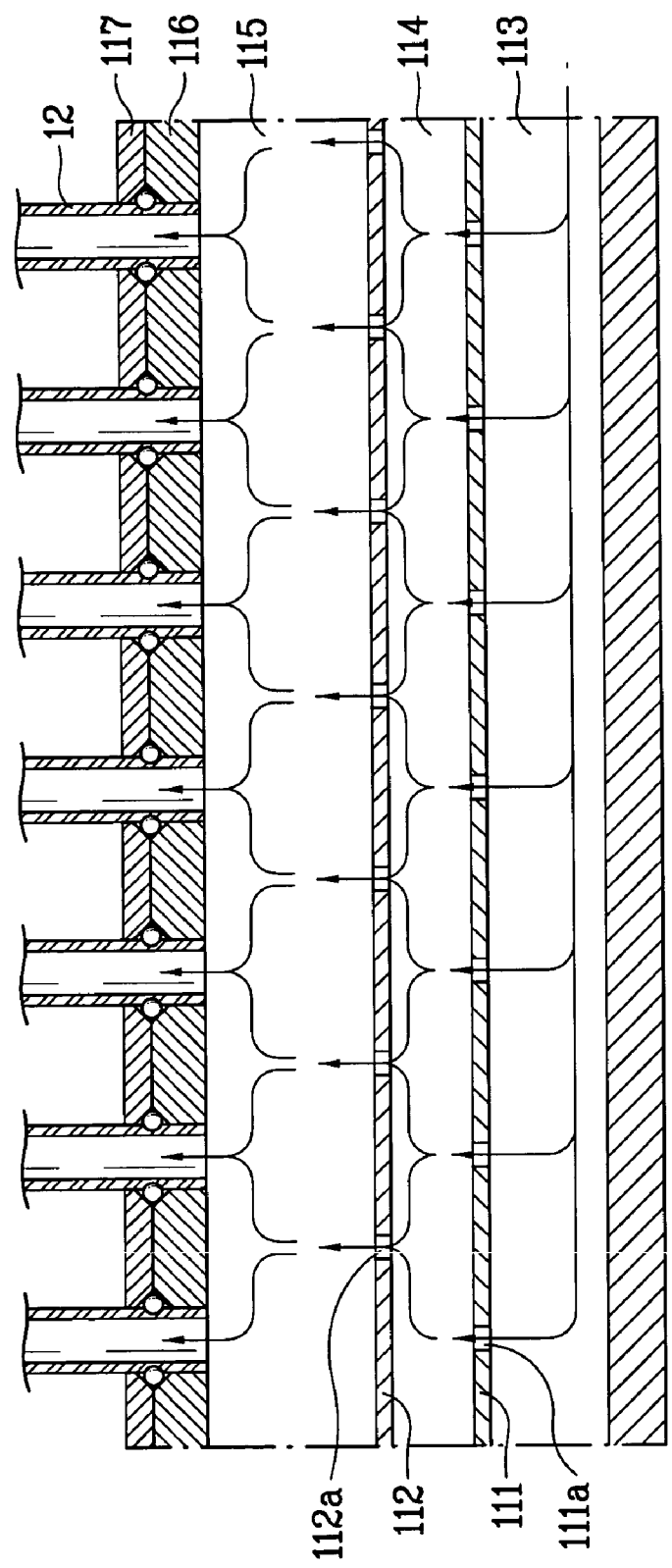
FIG. 7 is a schematic drawing explaining flow of cooling fluid in a cooling fluid flow passage formed in a supporting member in the device for compensating for heat deviation of FIG. 4.

Referring to FIG. 7, the cooling fluid introduced into the lower flow passage 113 is introduced into the intermediate buffer flow passage 114 through the connection holes 111a in the lower partition 111. Since portions of the connection holes 111a in the lower partition 111 are obstructed by the upper partition 112, the cooling fluid is dispersed and mixed in the intermediate buffer flow passage 114, thereby correcting a primary pressure head.

Next, the cooling fluid is introduced into the upper flow passage 115 from the intermediate buffer flow passage 114 through the connection holes 112a in the upper partition 112. The cooling fluid is dispersed and mixed in the upper flow passage 115, thereby correcting a secondary head as portions of the connection holes 112a in the upper partition 112 are also obstructed by the lower supporting member 116. Then, the cooling fluid is introduced into the nozzle members 12 through ends of the nozzle members 12.

Thus, since the cooling fluid introduced through the lower flow passage 113 is involved in two pressure head corrections before it is introduced into the nozzle members 12, cooling fluid with a comparatively uniform pressure is supplied to the nozzle members 12.

Figure 8:
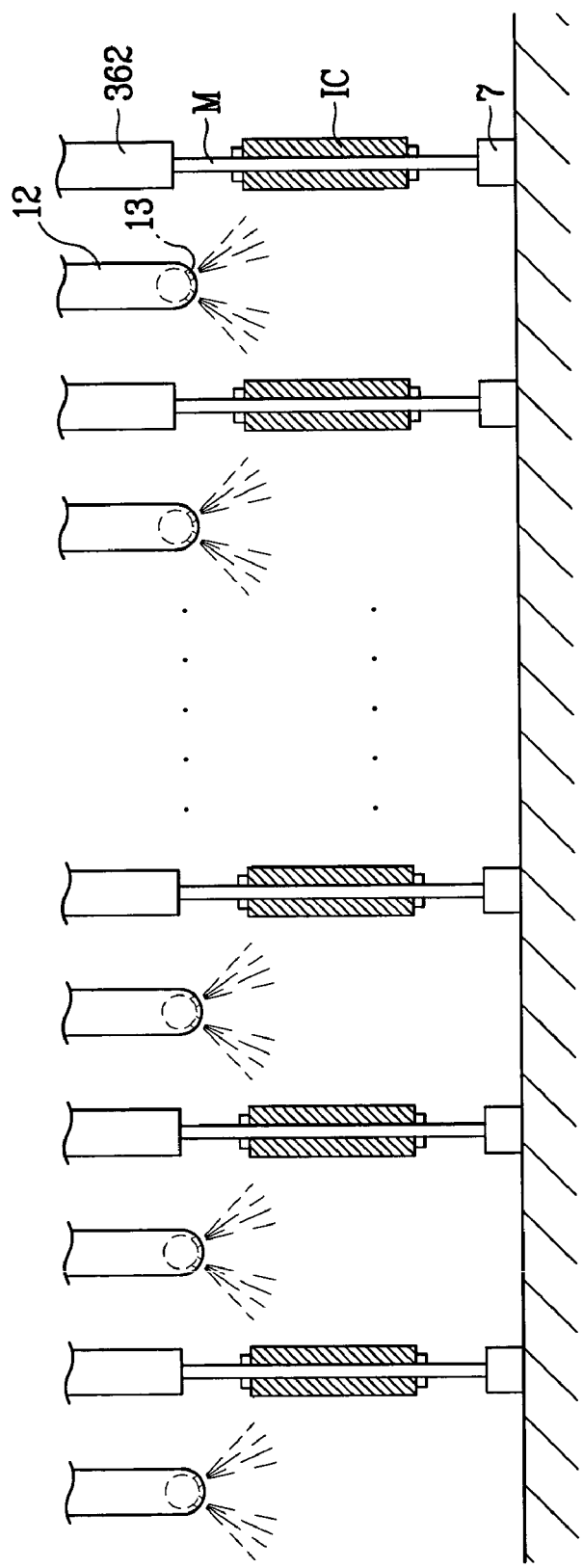
FIG. 8 is a schematic drawing illustrating operation of a device for compensating for heat deviation according to an embodiment of the invention.

Referring to FIG. 8, the cooling fluid introduced into the nozzle members 12 is discharged through the spray holes 13 in the nozzle members 12 in an oblique direction with respect to a central plane containing axes of the nozzle member 12. The cooling fluid is directed toward the IC chips positioned on both sides of the modular IC M mounted on the test socket 7, as the spray nozzles 13 are directed away from the central plane, and excellent cooling performance is achieved.

Along with improved cooling performance, the invention may provide the advantage of simple attachment of the nozzle members 12 to the supporting members 11. That is, when the nozzle member 12 is attached to the supporting members 11, after ends of the nozzle member 12 are inserted into the pass through holes 117a in the upper supporting member 117, the sealing rings 14 may be inserted from lower ends of the nozzle member 12 and positioned in the grooves 118 and in the grooves 121 of the nozzle member 12. The ends of the nozzle member 12 are inserted into the pass through holes 116a in the lower supporting member 116 so that the lower supporting member 116 and the upper supporting member 117 are joined.

In general, the cooling fluid used for the heat deviation compensation is a liquid gas, such as liquid nitrogen. That is, a mixed cooling fluid of liquid nitrogen and dry air may be utilized to prevent formation of frost caused by moisture.

As has been described above, the device for compensating for heat deviation according to an embodiment of the invention provides at least the following advantages.

Excellent cooling performance is achieved because cooling fluid is sprayed in an oblique direction from the nozzle member directly toward IC chips mounted on a modular IC during testing.

Further, the supply of the cooling fluid to the nozzle member passes through many stages, permitting supply of cooling fluid to the nozzle member at a uniform pressure, thereby further enhancing the effect of heat deviation compensation.

Additionally, easy attachment of the nozzle members to the supporting members shortens the assembly process.

The foregoing embodiments and advantages are merely exemplary and are not to be construed as limiting the invention. The present teaching can be readily applied to other types of apparatuses. The description of the invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A device for compensating for heat generation in a modular IC test handler configured to receive cooling fluid from an exterior source and spray the cooling fluid onto modular ICs during testing, wherein the device is attached to a press unit including a frame and a plurality of push bars arranged at fixed intervals on a front surface of the frame for pushing edges of modular ICs mounted on carriers to connect the modular ICs to test sockets, the device comprising:

a pair of supporting members provided adjacent to the press unit, each of the pair of supporting members having a cooling fluid flow passage formed therein for flow of cooling fluid; and at least one cooling fluid spraying unit extending between the pair of supporting members configured to be in fluid communication with the pair of supporting members so as to spray the cooling fluid supplied through the cooling fluid flow passages toward faces of modular ICs in an oblique direction with respect to a central plane of the at least one cooling fluid spraying unit.

2. The device as claimed in claim 1, wherein the at least one cooling fluid spraying unit comprises a plurality of cooling fluid spraying units.

3. The device as claimed in claim 1, wherein the at least one cooling fluid spraying unit comprises a plurality of cooling fluid spraying units each extending between the pair of supporting members.

4. The device as claimed in claim 1, wherein each at least one cooling fluid spraying unit comprises:
 a nozzle member having ends connected to the cooling fluid flow passages in the pair of supporting members so as to be in communication therewith and arranged between adjacent push bars, the nozzle member having at least one cooling fluid spraying hole.

5. The device as claimed in claim 4, wherein the nozzle member comprises a plurality of cooling fluid spray holes formed at fixed intervals in a longitudinal direction of the nozzle member and directed away in a circumferential direction from a central plane the nozzle member forms, and wherein the plurality of cooling fluid spray holes is configured to spray the cooling fluid guided through the nozzle member toward the modular ICs in an oblique direction.

6. The device as claimed in claim 5, wherein the plurality of cooling fluid spray holes are arranged in a plurality of pairs.

7. The device as claimed in claim 1, wherein the cooling fluid flow passage in each of the pair of supporting members is divided into a plurality of fluid flow passages by at least one partition extending in a lateral direction.

8. The device as claimed in claim 7, wherein the cooling fluid flow passage in each of the pair of supporting members includes three cooling fluid flow passages divided by two partitions, respectively.

9. The device as claimed in claim 8, wherein the three passages comprise an upper flow passage, a middle flow passage, and a lower flow passage, and wherein the upper flow passage is in communication with end portions of the nozzle members and the lower flow passage has an inlet configured to receive the cooling fluid from an exterior.

10. The device as claimed in claim 9, wherein the at least one cooling fluid spraying unit each comprises a nozzle member, and wherein the partitions have a plurality of connection holes provided at fixed intervals for flow of the cooling fluid introduced thereto through the lower flow passage, the middle flow passage, and the upper flow passage.

11. The device as claimed in claim 10, wherein ends of the nozzle members and the connection holes in the partitions are staggered with respect to one another.

12. The device as claimed in claim 1, wherein the pair of supporting members are arranged in parallel to the press unit.

13. The device as claimed in claim 1, wherein each of the pair of supporting members comprises an inlet in communication with a source of cooling fluid.

14. The device as claimed in claim 1, wherein the at least one cooling fluid spraying unit comprises a plurality of cooling fluid spray units, each comprising a nozzle member configured to be interposed between respective push bars of the press unit and extending parallel thereto.

15. A device for compensating for heat generation in a modular IC test handler configured to receive cooling fluid from an exterior source and spray the cooling fluid onto modular ICs during testing, wherein the device is attached to a press unit including a frame and a plurality of push bars arranged at fixed intervals on a front surface of the frame for pushing edges of modular ICs mounted on carriers to connect the modular ICs to test sockets, the device comprising:
 a pair of supporting members provided adjacent to the press unit, each having a cooling fluid flow passage formed therein for flow of cooling fluid, wherein each supporting member comprises:
  a lower supporting member having a plurality of pass through holes formed at fixed intervals; and
  an upper supporting member joined to an upper portion of the lower supporting member and having pass through holes provided at positions corresponding to the pass through holes in the lower supporting member, wherein a sealing device is provided between each of the pass through holes in the lower supporting member and each of the pass through holes in the upper supporting member; and
 at least one cooling fluid spraying unit configured to spray the cooling fluid supplied through the cooling fluid flow passage toward faces of modular ICs in an oblique direction with respect to a central plane of the at least one cooling fluid spraying unit, wherein the at least one cooling fluid spraying unit comprises a nozzle member having ends connected to the cooling fluid flow passages in the pair of supporting members so as to be in communication therewith and arranged between adjacent push bars, the nozzle member having a plurality of cooling fluid spray holes formed at fixed intervals in a longitudinal direction of the nozzle member and directed away in a circumferential direction from a central plane the nozzle member forms, and wherein an upper portion of each of the pair of supporting members is attached to one end of each of the nozzle members.

16. The device as claimed in claim 15, wherein the sealing device is an elastic sealing ring.

17. The device as claimed in claim 16, wherein the sealing ring is formed of silicone.

18. The device as claimed in claim 15, wherein the end portion of each of the nozzle members has a groove for receiving therein a portion of the sealing device.

19. A modular IC test handler, comprising:
 a plurality of test sockets;
 a press unit including a frame and a plurality of push bars arranged at fixed intervals on a front surface of the frame for pushing edges of modular ICs mounted on carriers to connect the modular ICs to the plurality of test sockets; and
 a device for compensating for heat generation from the modular ICs during testing, the device comprising:
  a pair of supporting members provided adjacent to the press unit, each of the pair of supporting members having a cooling fluid flow passage formed therein for flow of cooling fluid; and
  at least one cooling fluid spraying unit extending between the pair of supporting members and configured to be in fluid communication with each of the pair of supporting members so as to spray the cooling fluid supplied through the cooling fluid flow passages toward faces of modular ICs in an oblique direction with respect to a central plane of the at least one cooling fluid spraying unit.

20. The device as claimed in claim 19, wherein the at least one cooling fluid spraying unit comprises a plurality of cooling fluid spraying units.

21. The device as claimed in claim 19, wherein the at least one cooling fluid spraying unit comprises:
  a nozzle member having ends connected to the cooling fluid flow passages in the pair of supporting members so as to be in communication therewith and arranged between adjacent push bars, each nozzle member having at least one cooling fluid spraying hole.

22. The device as claimed in claim 21, wherein the nozzle member comprises a plurality of cooling fluid spray holes formed at fixed intervals in a longitudinal direction of the nozzle member and directed away in a circumferential direction from a central plane the nozzle member forms, and wherein the plurality of cooling fluid spray holes are configured to spray the cooling fluid guided through the nozzle member toward the modular ICs in an oblique direction.

23. The device as claimed in claim 22, wherein the plurality of cooling fluid spray holes are arranged in a plurality of pairs.

24. The device as claimed in claim 19, wherein the cooling fluid flow passage in each of the pair of supporting members is divided into a plurality of cooling fluid flow passages by at least one partition extending in a lateral direction.

25. The device as claimed in claim 24, wherein the plurality of cooling fluid flow passages comprises an upper flow passage, a middle flow passage, and a lower flow passage, and wherein the upper flow passage is in communication with end portions of a nozzle member of the at least one cooling fluid spray unit and the lower flow passage has an inlet configured to receive cooling fluid from an external source.

26. The device as claimed in claim 25, wherein the partitions have a plurality of connection holes provided at fixed intervals for flow of the cooling fluid introduced thereto through the lower flow passage, the middle flow passage, and the upper flow passage.

27. The device as claimed in claim 26, wherein ends of the nozzle members and the connection holes in the partitions are staggered with respect to one another.

28. The device as claimed in claim 19, wherein the at least one cooling fluid spraying unit comprises a plurality of cooling fluid spraying units, each comprising a nozzle member configured to be interposed between respective push bars of the press unit and extending parallel thereto.

29. A device for compensating for heat generation in a modular IC test handler configured to receive cooling fluid from an exterior source and spray the cooling fluid onto modular ICs during testing, wherein the device is attached to a press unit including a frame and a plurality of push bars arranged at fixed intervals on a front surface of the frame for pushing edges of modular ICs mounted on carriers to connect the modular ICs to test sockets, the device comprising:
  a pair of supporting members provided adjacent to the press unit, each of the pair of supporting members having a cooling fluid flow passage formed therein for flow of cooling fluid; and
  at least one cooling fluid spraying unit configured to be supported by the pair of supporting members so as to be interposed between the plurality of push bars of the press unit and configured to spray the cooling fluid supplied through the cooling fluid flow passage toward modular ICs connected to the test sockets of the handler.

30. The device as claimed in claim 29, wherein the at least one cooling fluid spraying unit is configured to extend parallel to the push bars.

31. The device as claimed in the claim 29, wherein the at least one cooling fluid spraying unit is configured to spray the cooling fluid supplied through the cooling fluid flow passage toward faces of modular ICs in an oblique direction with respect to a planar surface formed by the at least one cooling fluid spraying unit.

* * * * *